US010796984B2

(12) United States Patent
Rodriguez et al.

(10) Patent No.: US 10,796,984 B2
(45) Date of Patent: Oct. 6, 2020

(54) LEADFRAME HAVING A CONDUCTIVE LAYER PROTRUDING THROUGH A LEAD RECESS

(71) Applicant: STMicroelectronics, Inc., Calamba (PH)

(72) Inventors: Rennier Rodriguez, Bulacan (PH); Raymond Albert Narvadez, Santa Rosa (PH); Ernesto Antilano, Jr., Binan Laguna (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 16/249,612

(22) Filed: Jan. 16, 2019

(65) Prior Publication Data

US 2019/0148271 A1    May 16, 2019

Related U.S. Application Data

(62) Division of application No. 15/399,536, filed on Jan. 5, 2017, now abandoned.

(51) Int. Cl.
| | |
|---|---|
| *H01L 23/495* | (2006.01) |
| *H01L 23/31* | (2006.01) |
| *H01L 21/48* | (2006.01) |
| *H01L 21/56* | (2006.01) |
| *H01L 23/00* | (2006.01) |

(52) U.S. Cl.
CPC .... *H01L 23/49555* (2013.01); *H01L 21/4842* (2013.01); *H01L 21/563* (2013.01); *H01L 21/565* (2013.01); *H01L 23/3121* (2013.01); *H01L 24/29* (2013.01); *H01L 24/32* (2013.01); *H01L 24/48* (2013.01); *H01L 24/73* (2013.01);
(Continued)

(58) Field of Classification Search
CPC . H01L 23/495–49596; H01L 23/49861; H01L 21/4821–4842; H01L 33/62; H01L 21/4846–4867; H01L 23/498–49866; H01L 23/045–051; H01L 23/055–057; H01L 21/56–568; H01L 23/28–3192; H01L 31/0203; H01L 31/0481–0488; H01L 33/52–56; H01L 51/107; H01L 51/448; H01L 51/5237–5259
See application file for complete search history.

(56) References Cited

U.S. PATENT DOCUMENTS

| | | |
|---|---|---|
| 6,339,261 B1 | 1/2002 | Yonemochi et al. |
| 6,365,980 B1 | 4/2002 | Carter, Jr. et al. |

(Continued)

*Primary Examiner* — Younes Boulghassoul
(74) *Attorney, Agent, or Firm* — Seed Intellectual Property Law Group LLP (57) ABSTRACT

The present disclosure is directed to a leadframe package having leads with protrusions on an underside of the leadframe. The protrusions come in various shapes and sizes. The protrusions extend from a body of encapsulant around the leadframe to couple to surface contacts on a substrate. The protrusions have a recess that is filled with encapsulant. Additionally, the protrusions may be part of the lead or may be a conductive layer on the lead. In some embodiments a die pad of the leadframe supporting a semiconductor die also has a protrusion on the underside of the leadframe. The protrusion on the die pad has a recess that houses an adhesive and at least part of the semiconductor die. The die pad with a protrusion may include anchor locks at the ends of the die pad to couple to the encapsulant.

21 Claims, 8 Drawing Sheets

(52) U.S. Cl.
CPC .............. *H01L 24/83* (2013.01); *H01L 24/85* (2013.01); *H01L 2224/2919* (2013.01); *H01L 2224/32245* (2013.01); *H01L 2224/48091* (2013.01); *H01L 2224/48247* (2013.01); *H01L 2224/73265* (2013.01); *H01L 2224/83005* (2013.01); *H01L 2224/85005* (2013.01); *H01L 2924/1815* (2013.01); *H01L 2924/351* (2013.01)

(56) References Cited

U.S. PATENT DOCUMENTS

| | | | |
|---|---|---|---|
| 6,441,502 | B2 | 8/2002 | Yamada et al. |
| 7,944,043 | B1* | 5/2011 | Chung .................... H01L 24/83 |
| | | | 257/698 |
| 2005/0073032 | A1 | 4/2005 | Tao |
| 2007/0273017 | A1* | 11/2007 | Maloney ................ H05K 3/341 |
| | | | 257/690 |
| 2008/0258279 | A1* | 10/2008 | Lin ....................... H05K 3/3426 |
| | | | 257/676 |
| 2009/0243077 | A1 | 10/2009 | Chow et al. |
| 2009/0289356 | A1* | 11/2009 | Camacho ................ H01L 24/05 |
| | | | 257/737 |
| 2009/0321913 | A1* | 12/2009 | Shim ....................... H01L 24/49 |
| | | | 257/690 |
| 2010/0001385 | A1 | 1/2010 | Caparas et al. |
| 2010/0123230 | A1* | 5/2010 | Dahilig ............... H01L 21/4832 |
| | | | 257/676 |
| 2011/0062569 | A1* | 3/2011 | Yow .................... H01L 23/4951 |
| | | | 257/676 |
| 2012/0133033 | A1* | 5/2012 | Camacho ............ H01L 21/4832 |
| | | | 257/666 |

\* cited by examiner

LEADFRAME HAVING A CONDUCTIVE LAYER PROTRUDING THROUGH A LEAD RECESS

BACKGROUND

Technical Field

The present disclosure is directed to a non-planar leadframe design and, in particular, to a leadframe that includes leads with protrusions that extend outside of the package for coupling the leads to a substrate.

Description of the Related Art

Semiconductor and leadframe packages often include a semiconductor die and a leadframe that provides an interface between external contacts and the semiconductor die. The semiconductor can include an encapsulant to secure the elements of the package into a single discrete unit. The semiconductor die is typically placed on the leadframe, and the combination is covered with encapsulant in an application chamber. The encapsulant is typically applied at high pressure or temperature, and is then allowed to cool and solidify around the package elements.

No-lead leadframes, such as quad-flat no-lead multiple-row (QFN-MR) leadframes, have integrated leads that are embedded in an encapsulant, with a side of the leads coplanar with a side of the encapsulant. The leads in these leadframes may suffer from degraded performance due to poor connections between the embedded leads and external contacts, such as those on a printed circuit board (PCB). The leads of the leadframe can be formed from copper, which may have insufficient wettability for establishing a low resistance electrical connection between the lead and the PCB.

In addition, the planar surface of the bottom of the leadframe package may encourage any solder to evacuate the space between the leadframe package and a PCB. Thus, what is needed is a device that encourages a higher quality of solder bonding between a lead of a leadframe and a substrate interfacing with the leadframe to which the lead is attached.

BRIEF SUMMARY

The present disclosure is directed to a leadframe package with a lead having a protrusion. The leadframe package includes a semiconductor die, a leadframe, and an encapsulant. The leadframe includes a lead and a die pad, with the die pad supporting the semiconductor die and the lead including the protrusion. The lead is electrically coupled to a contact on the semiconductor die using an electrical connector. The leadframe and the semiconductor die are encased by the encapsulant, and a portion of the protrusion has a recess filled with the encapsulant.

In some embodiments, the leadframe is coupled to a PCB. The PCB includes a contact pad, with the protrusion of the leadframe on the contact pad of the PCB. Furthermore, the protrusion is surrounded by a joint compound, such as solder, the solder forming an electrical and mechanical bond between the surface contact of the PCB and the protrusion of the leadframe.

In other embodiments, the lead has any number of shapes and configurations. For examples, the protrusion of the lead may have a cross-sectional shape that is circular, oblong, rectangular, triangular, or freeform. Additionally, the lead may be embedded in the encapsulant such that only the protrusion is exposed through the encapsulant. The lead may include a conductive layer and the conductive layer may include some or all of the protrusion In some embodiments, the die pad of the leadframe also includes a protrusion. The protrusion of the die pad includes a recess with a portion of the semiconductor die in the recess of the protrusion of the die pad. The encapsulant also is in the recess of the protrusion of the die pad. In further embodiments, the protrusion of the die pad is coupled to a second surface contact of the die pad by a second joint compound surrounding the protrusion of the die pad.

In some embodiments with a protrusion on the die pad, the die pad includes an anchor on a first end of the die pad. The anchor may be a flared end of the die pad, such that the flared end is secured by being surrounded by encapsulant, preventing the end of the die pad from slipping out of the encapsulant under stress. Alternatively, the anchor may include a side of the die pad in the encapsulant having a concave surface.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Throughout the specification, the term "layer" is used in its broadest sense to include a thin film, a cap, or the like, and one layer may be composed of multiple sub-layers.

Specific embodiments of leadframe packages are described herein; however, the present disclosure and the reference to certain materials, dimensions, and the details and ordering of processing steps are exemplary and should not be limited to those shown.

Figure 1:
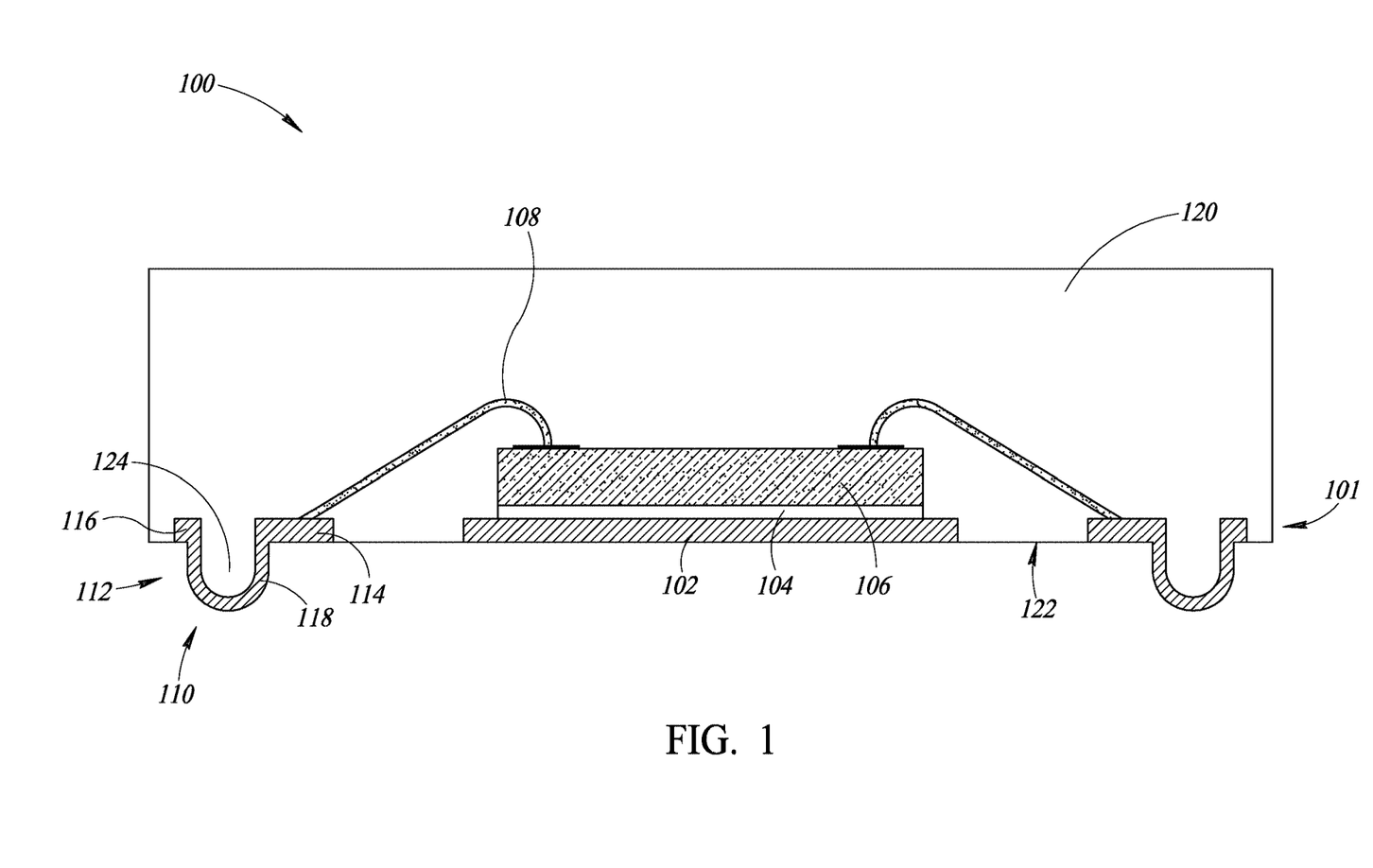
FIG. 1 is a cross-sectional view of an exemplary leadframe having a protrusion.

The present disclosure is generally directed to leadframe packages, such as the exemplary leadframe package 100 shown in FIG. 1. The leadframe package 100 includes a leadframe 101 having a die pad 102 and a lead 110. A semiconductor die 106 is secured to the die pad 102 using an adhesive 104. The semiconductor die 106 is electrically coupled to the lead 110 using an electrical connector 108, such as a bond wire. The lead 110 has a protrusion 112 that includes a portion of the lead 110 that extends away from a first portion 114 and a second portion 116 of the lead 110. The protrusion 112 includes a protruding portion 118 of the lead 110 and a protruding portion 124 of an encapsulant 120 that is inside the protruding portion 118 of the lead 110. The protruding portion 124 of the encapsulant 120 and the protruding portion 118 of the lead 110 extend away from a bottom side 122 of the encapsulant 120. One side of the die pad 102 is exposed through the bottom side 122 of the encapsulant 120. The protrusion 112 may provide an improved interface between the leadframe package 100 and a PCB (not shown).

FIGS. 2-6 are views of a leadframe package 200 in various stages of a process of forming the package.

Figure 2:
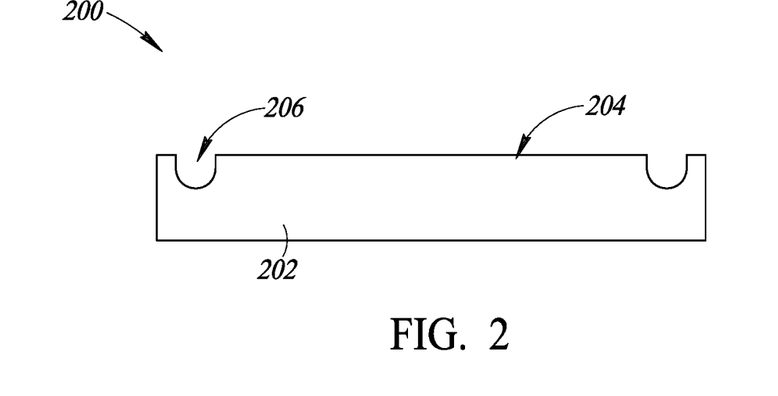
FIGS. 2-6 are cross-sectional views of a method of manufacturing a leadframe having a protrusion.

As represented in the cross-sectional view of FIG. 2, a method of manufacturing for the leadframe package 200 is shown beginning with a mold 202. Other methods of manufacturing the leadframe package 200 are possible, and the initial step shown in FIG. 2 need not be the first step in manufacturing in all embodiments. The mold 202 is shown having a top side 204. A recess 206 is etched through the top side 204 of the mold 202. The etching may be a chemical etching process, a mechanical etching process, or some other known etching process. A cross-section of the recess 206 may be any number of shapes, including circular, oblong, rectangular, triangular, or any other shape, including freeform shapes. Additional, the three dimensional shape may also be any number of shapes, such as a cube, prism, sphere, cylinder, cone, pyramid, or any other shape including freeform. Additionally, the two or three dimensional shapes may have an orientation with respect to the leadframe. FIG. 2 demonstrates the recess 206 with an approximately semi-circular shape. In some embodiments, there is more than one place for a single lead frame in the mold 202, with some embodiments having locations for hundreds of lead frames, to be made at the same time, with the proper number of recess for each lead of each leadframe associated with the mold 202.

Figure 3:
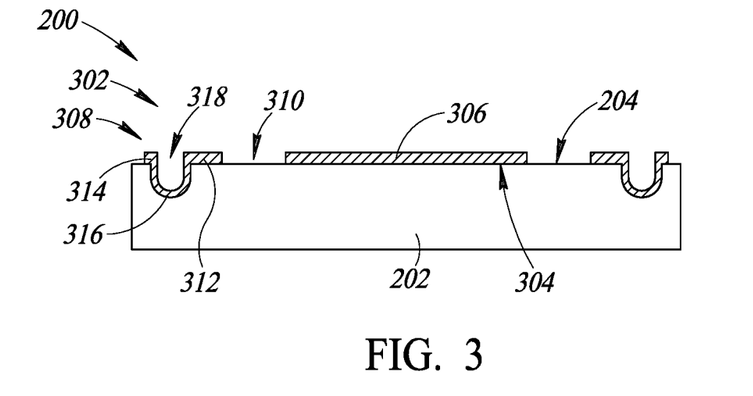

FIG. 3 is a cross-sectional view of the leadframe package 200 with a leadframe 302 being formed on the mold 202. The leadframe 302 has a bottom side 304 on the top side 204 of the mold 202. The leadframe 302 includes a die pad 306 and a lead 308 separated from the die pad 306 by a space 310. In some embodiments, there is more than one lead in the leadframe 302, with some embodiments having not only multiple leads, but multiple rows of leads, such as a QFN-MR package. Some or all of these leads may be of the type in shown in FIG. 3. Some embodiments of the leadframe 302 include a leadframe 302 formed from copper, a copper alloy, or some other leadframe material. In other embodiments, the leadframe 302 is formed from any electrical and/or thermal conductor.

In one embodiment, the leadframe 302 has a planar form factor that is stamped to form the leadframe 302. In this embodiment, the leadframe 302 may be pre-formed with space 310, or space 310 may be formed as part of the stamping process. The stamping may be conducted with the use of a mandrel or other implement useful for stamping. During the stamping, a protrusion on the stamp is pressed into the lead 308 to force the lead 308 into the recess 206 of the mold 202. To aid in the stamping process, the stamping may be conducted at various temperatures.

In another embodiment, the leadframe 302 is formed by blanket depositing a layer on a top side of the mold 202 and etching the layer to shape the leadframe 302. The leadframe may be etched using any known masking and etching chemistry, such as a selective etchant or a non-selective etchant, and a wet etch or a dry etch. Additionally, the etching may be isotropic, anisotropic, or completely anisotropic.

In yet another embodiment, the leadframe 302 is formed on the mold 202 as a nonplanar layer. For instance, the leadframe may be applied by electro-plating, metallization, or any other deposition process. Using these processes, the leadframe may be applied on the top side 204 of the mold 202 and in the recess 206 of the mold 202. The space 310 may be formed during the deposition process by using an inhibitor, or may be formed at a later stage of manufacturing through a removal process.

The lead 308 includes a first portion 312, a second portion 314, and a protruding portion 316 coupled between the first portion 312 and the second portion 314. The protruding portion 316 may include, in whole or in part, a convex surface that extends from the first portion 312 or the second portion 314. The first portion 312, the second portion 314, and the protruding portion 316 may have the same thickness as each other, and as the die pad 306. In other embodiments, there is no second portion 314 of the lead 308. The protruding portion 316 of the lead 308 may electrically and mechanically couple the first portion 312 to the second portion 314. Additionally, in some embodiments, the protruding portion 316 of the lead 308 forms a recess 318 such that the protruding portion 316 has a concave surface facing the recess 318. The recess 318 may extend from a top side of the lead 308 to beyond a first plane at the bottom side 304 of the leadframe 302 at the die pad 306, or alternatively, to beyond a second plane at the bottom side 304 of the leadframe 302 at the first portion 312 of the lead 308. In some embodiments, the protruding portion 316 of the leadframe 302 has a thickness that is less than the thickness of the first portion 312 or the second portion 314 of the lead 308. Furthermore, the protruding portion 316 of the lead 308 may have a uniform thickness between the first portion 312 and the second portion 314 of the lead 308. In some embodiments, approximately half of the volume of the recess 318 is between the first or second plane and the protruding portion 316 on the bottom side 304 of the leadframe 302. In some embodiments, the protruding portion 316 of the lead 308 covers the entirety of the recess 206 etched in the mold 202. The lead 308 may also include a contact pad positioned on a side opposite the bottom side 304.

Figure 4:
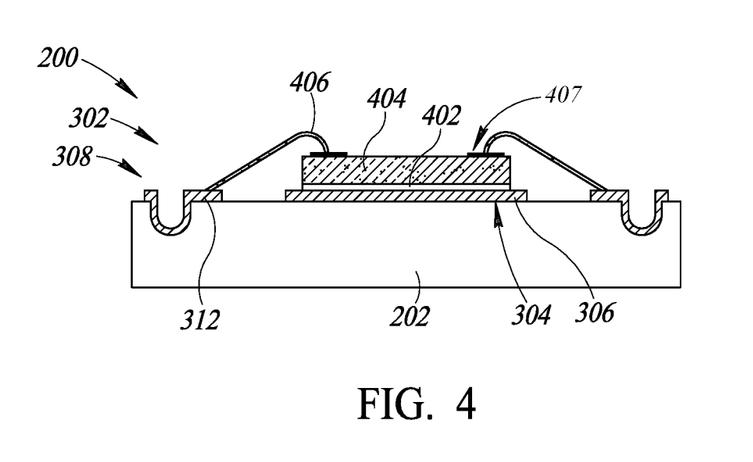

FIG. 4 is a cross-sectional view of the leadframe package 200 with a semiconductor die 404 coupled to the leadframe 302. The semiconductor die 404 may be any number of different types of semiconductor dice that provide processing of signals, such as very basic electrical elements, to complex integrated circuits and microcontrollers. The semiconductor die 404 die is shown with a rectangular cross-section; however other shapes of semiconductor die are also compatible. The semiconductor die 404 is coupled to the die pad 306 of the leadframe 302 by an adhesive 402. In some embodiments, the adhesive 402 is a die attach film (DAF). In other embodiments, the adhesive 402 is epoxy glue. And in further embodiments, the adhesive 402 is any adhesive suitable for attaching a semiconductor die to a leadframe. In some embodiments, the adhesive 402 is electrically and/or thermally conductive, and couples the semiconductor die 404 to the leadframe 302 electrically and/or thermally. In manufacturing, the adhesive 402 may be applied before or after the semiconductor die 404 and the die pad 306 of the leadframe 302 are positioned adjacent to one another. Furthermore, the adhesive 402 may be applied to the die pad 306 or applied to the semiconductor die 404. The semiconductor die 404 is further electrically coupled to the lead 308 using electrical connector 406. The electrical connector 406 is electrically coupled to the contact pad on the lead 308 at a first end of the electrical connector 406. The electrical connector 406 is electrically coupled to a top contact pad 407 of the semiconductor die 404 at a second end of the electrical connector 406. In some embodiments, the electrical connector 406 is a bond wire.

Figure 5:
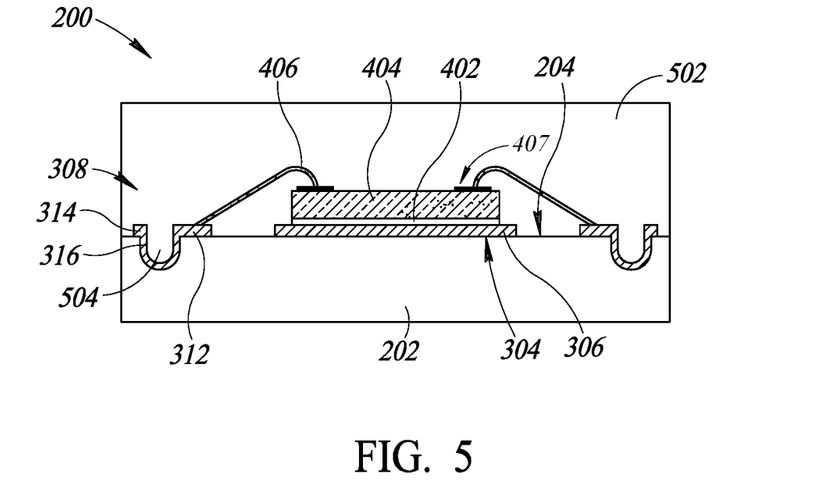

FIG. 5 is a cross-sectional view of the leadframe package 200 after being surrounded with encapsulant. An encapsulant 502 is formed over the top side 204 of the mold 202. The encapsulant 502 may be any acceptable semiconductor molding compound, with a number of different known types of encapsulants, such as various polymer encapsulants. In some embodiments the encapsulant is an electrical or thermal insulator, and in one embodiment the encapsulant provides structural support to the leadframe package 200. In some embodiments, the encapsulant surrounds all the exposed surfaces of the semiconductor die 404 and the leadframe 302. In other embodiments, the lead 308 may not be fully surrounded by the encapsulant 502. In some embodiments, the encapsulant 502 is formed using an injection molding process in which encapsulant 502 is applied under high pressure and/or temperature. During the application of the encapsulant 502 to the leadframe 302 and the semiconductor die 404, the encapsulant 502 flows into the recess 318 of the protruding portion 316 to form a protruding portion 504 of the encapsulant 502. The internal part of the recess is a concave portion in which the encapsulant flows during the molding process. The concave region is therefore filled with the molding compound. This provides structural and mechanical reinforcement and strength to the lead 308.

Figure 6:
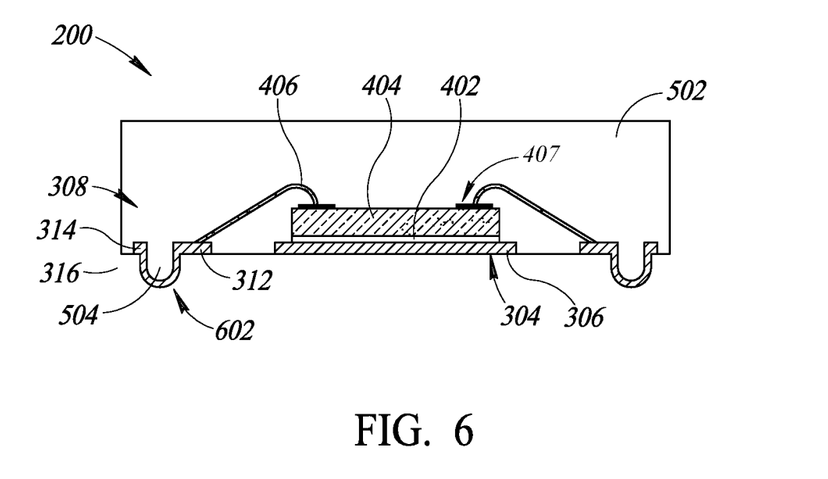

FIG. 6 is a cross-sectional view of the leadframe package 200 after removal of the mold 202. After application of the encapsulant 502, the mold 202 can be removed without affecting the position of the elements of the leadframe 302 relative to each other. The removal of the mold 202 exposes the lead 308 and the die pad 306 through a bottom side of the encapsulant 502 at the bottom side 304 of the leadframe 302. The exposed protruding portion 316 of the lead 306 and the protruding portion 504 of the encapsulant 502 form a protrusion 602. The protrusion 602 is configured to interface with a PCB by being positioned on a contact of a PCB, another chip package, or any other substrate, for example. The lead 308 can then be electrically and mechanically coupled to the contact so the semiconductor die 404 can then send and/or receive signals through the protruding portion 316 of the lead 308 to the PCB.

Figure 7A:
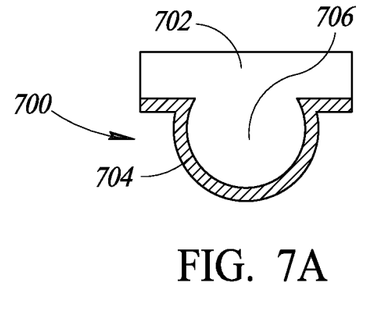
FIGS. 7A-7F are cross-sectional views of different types of protrusions.

FIGS. 7A-7F are cross-sectional views of different shapes for protrusions. In particular, FIG. 7A shows a protrusion 700 on a layer of encapsulant 702. The protrusion 700 includes a convex protruding portion 704 of a lead that is electrically coupled of a semiconductor die. The protruding portion 704 of the lead has a recess with a concave, internal region into which a portion 706 of the encapsulant flows during molding. The protrusion 700 has a rounded shape, or a partial circular shape when viewed along a two-dimensional cross-section. In some embodiments, the protrusion 700 has a shape that is greater than half of a circle. For example, a concave surface of the protruding portion 704 may form to between 55% and 99% of a circle, such as 75% of a circle. Alternatively, or in addition, the convex surface of the protruding portion 704 may form to between 55% and 99% of a circle, such as 75% of a circle. In these embodiments, the protruding portion 704 may form a less than 90 degree angle with a bottom surface of the encapsulant 702 where they join. In other embodiments, the protrusion 700 has a shape that resembles approximately half of a circle. For example, a concave surface of the protruding portion 704 may form to between 45% and 55% of a circle. Alternatively, or in addition, the convex surface of the protruding portion 704 may form to between 45% and 55% of a circle. In these embodiments, the protruding portion 704 may form approximately a 90 degree angle with a bottom surface of the encapsulant 702 where they join. Other parts of the protrusion 700 may have an identical, similar, or completely different cross-section than the one shown in FIG. 7A.

Figure 7B:
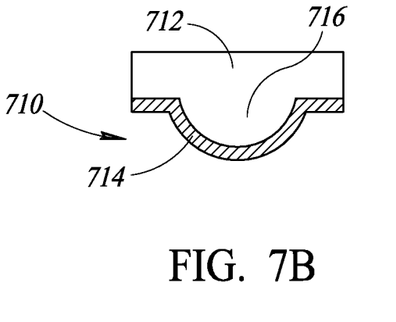

FIG. 7B shows a protrusion 710 on a layer of encapsulant 712. The protrusion 710 includes a protruding portion 714 of a lead that is electrically coupled to a semiconductor die. The protruding portion 714 of the lead has a recess with a protruding portion 716 of the encapsulant in the recess of the protruding portion 714 of the lead. The protrusion 710 has a partial circular shape when viewed along a two-dimensional cross-section. In some embodiments, the protrusion 710 has a shape that resembles less than half of a circle. For example, a concave surface of the protruding portion 714 may form to between 1% and 45% of a circle, such as 40% of a circle. Alternatively, or in addition, the convex surface of the protruding portion 714 may form to between 1% and 45% of a circle, such as 40% of a circle. In these embodiments, the protruding portion 714 may form a greater than 90 degree angle with a bottom surface of the encapsulant 712 where they join. Other parts of the protrusion 710 may have an identical, similar, or completely different cross-section than the one shown in FIG. 7B.

Figure 7C:
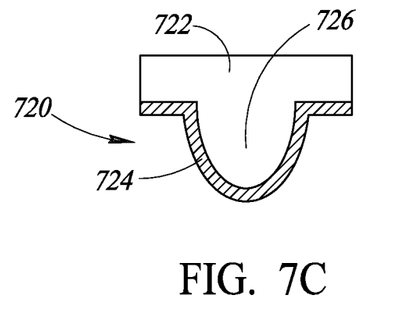

FIG. 7C shows a protrusion 720 on a layer of encapsulant 722. The protrusion 720 includes a protruding portion 724 of a lead that is electrically coupled to a semiconductor die. The protruding portion 724 of the lead has a recess with a protruding portion 726 of the encapsulant in the recess of the protruding portion 724 of the lead. The protrusion 720 has an elliptical or oblong shape when viewed along a two-dimensional cross-section. Other parts of the protrusion 720 may have an identical, similar, or completely different cross-section than the one shown in FIG. 7C.

Figure 7D:
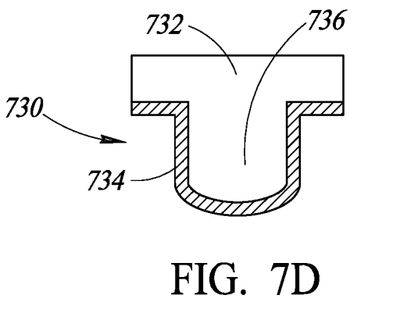

FIG. 7D shows a protrusion 730 on a layer of encapsulant 732. The protrusion 730 includes a protruding portion 734 of a lead that is electrically coupled to a semiconductor die. The protruding portion 734 of the lead has a recess with a protruding portion 736 of the encapsulant in the recess of the protruding portion 734 of the lead. The protrusion 730 has a rectangular shape with a rounded tip shape when viewed along a two-dimensional cross-section. In this embodiment, the protrusion 730 has a first flat sidewall and a second flat sidewall both extending from the lead parallel to one another, and a bottom wall that is similar to any of the shapes described with respect to FIGS. 7A-7C and 7F. Other parts of the protrusion 730 may have an identical, similar, or completely different cross-section than the one shown in FIG. 7D.

Figure 7E:
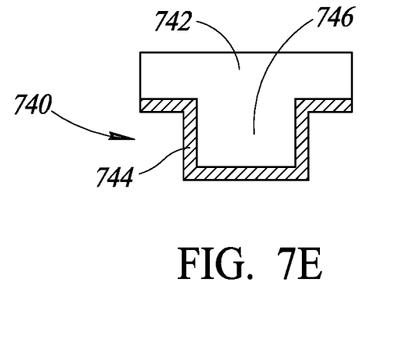

FIG. 7E shows a protrusion 740 on a layer of encapsulant 742. The protrusion 740 includes a protruding portion 744 of a lead that is electrically coupled to a semiconductor die. The protruding portion 744 of the lead has a recess with a protruding portion 746 of the encapsulant in the recess of the protruding portion 744 of the lead. The protrusion 740 has a rectangular shape when viewed along a two-dimensional cross-section. In this embodiment, the protrusion 740 has a first flat sidewall and a second flat sidewall both extending from the lead parallel to one another, and a bottom flat wall that is perpendicular to the flat sidewalls. Other parts of the protrusion 740 may have an identical, similar, or completely different cross-section than the one shown in FIG. 7E.

Figure 7F:
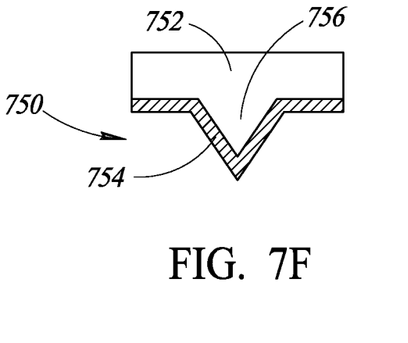

FIG. 7F shows a protrusion 750 on a layer of encapsulant 752. The protrusion 750 includes a protruding portion 754 of a lead that is electrically coupled to a semiconductor die. The protruding portion 754 of the lead has a recess with a protruding portion 756 of the encapsulant in the recess of the protruding portion 754 of the lead. The protrusion 750 has a triangular shape when viewed along a two-dimensional cross-section. Other parts of the protrusion 750 may have an identical, similar, or completely different cross-section than the one shown in FIG. 7F.

The protrusions shown in FIGS. 7A-7F may be formed from any of the types of materials and may be formed using any of the processes discussed with respect to the other figures, although certain processes may be better suited for certain form factors. For example, the embodiments shown in FIGS. 7B-7D may be easier to stamp than the embodiments shown in FIGS. 7A, 7E, and 7F. The various protrusions of encapsulant may provide structural support to the respective protrusions of the leads. Furthermore, the cross-sectional shapes illustrated in FIGS. 7A-7F may be rotated with respect to the respective encapsulant, and the percentage of the cross-sectional shapes emerging from the encapsulant may be varied, as design needs dictate.

It is not required that the internal, concave portion and external, convex portion of the led 308 have the same shape. For example, the thickness of the lead 308 may vary to provide an ellipse on the outside convex portion as shown in FIG. 7C, but the internal, concave portion might be in the shape of a box, a square, or another shape. Similarly, the convex outside shape of protrusion 734 may extend out as an oval, with flat sides, but the convex inside shape may be a circular concave shape like FIG. 7A on the inside. Additionally, the internal or external shape of the portion may include a corrugated shape, having many small recesses, pockets, or other internal structures to adhere to the molding compound or joint compound.

Figure 8:
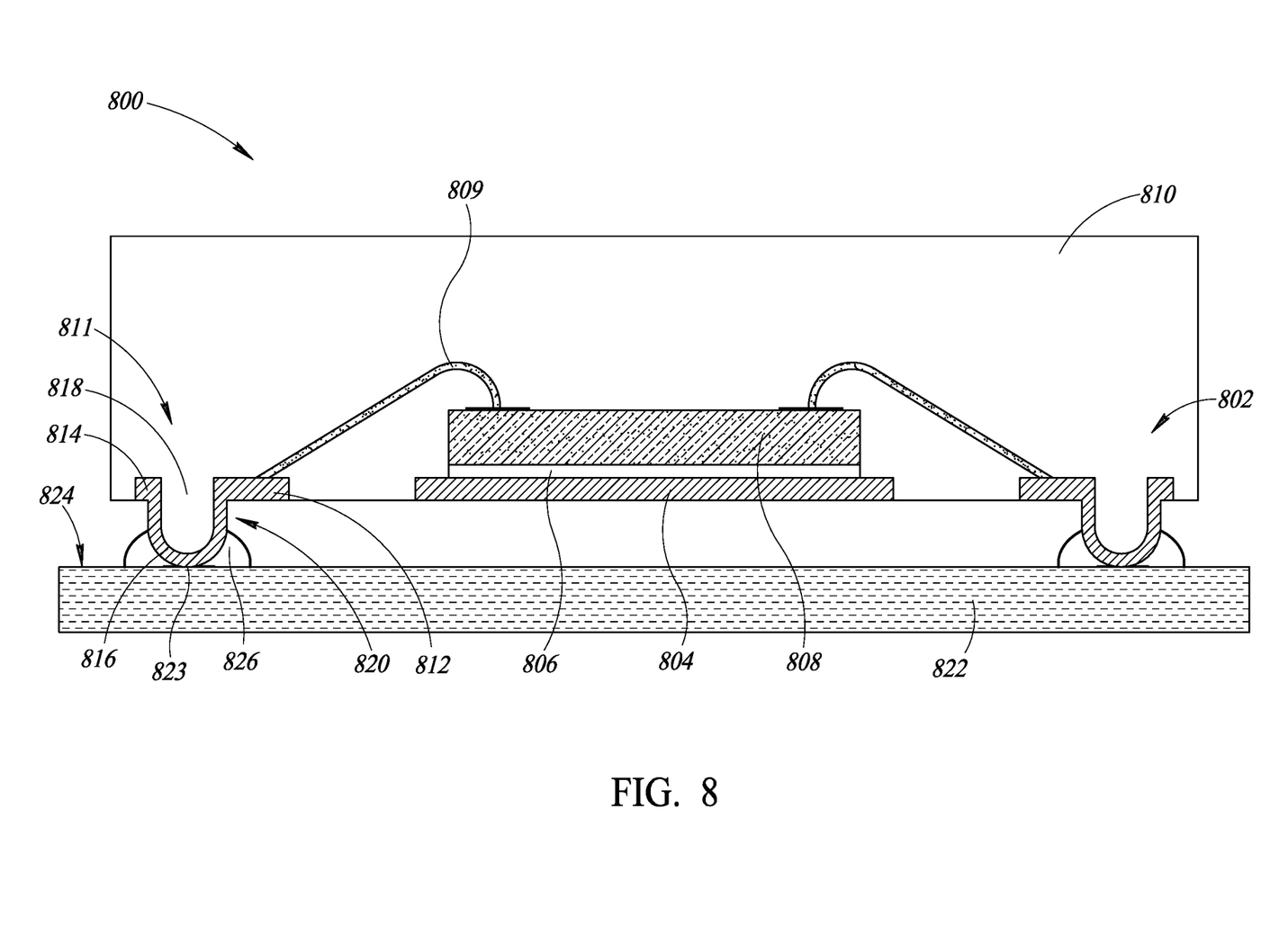
FIG. 8 is a cross-sectional view of a leadframe with a protrusion on a substrate.

FIG. 8 is a cross-sectional view of the leadframe package 800, similar to that of FIG. 1 with the protrusion 820 connecting the leadframe package 800 to a substrate 822 on the convex side. The leadframe package 800 includes a leadframe 802 with a die pad 804. On the die pad 804 of the leadframe 802 is an adhesive 806 that couples the die pad 804 to a semiconductor die 808. The semiconductor die 808 is surrounded by an encapsulant 810. The leadframe 802 is in the encapsulant 810, but is exposed through a bottom side of the encapsulant 810.

The leadframe 802 also includes a lead 811 that is separated from the die pad 804 but is electrically coupled to the semiconductor die 808. The electrical coupling between the lead 811 and the semiconductor die 808 may be over an electrical connector 809, or over any other electrical connector. The lead 811 has a first portion 812, a second portion 814, and a protruding portion 816 that mechanically and electrically couples the first portion 812 to the second portion 814. The protruding portion 816 has an internal, concave recess, the concave portion of the recess being filled with encapsulant 810 to form a protruding portion 818 of encapsulant 810. The protruding portion 816 of the lead 811 and the protruding portion 818 of the encapsulant 810 form a protrusion 820. The protrusion 820 may be any of the types discussed with respect to the other figures.

The protrusion 820 is coupled to a metal pad 823 on a top side 824 of a substrate 822. The substrate 822 may be of any of the types discussed with respect to the other figures and, in one embodiment, the substrate 822 is a PCB with a surface contact pad. The protruding portion 816 of the lead 811 contacts the metal pad 823 on the top side 824 of the substrate 822, and in one embodiment, the end is pressed with a force to be in an abutting surface contact on the substrate 822. The protrusion 820 is surrounded by a joint compound 826. The joint compound may be any substance used to secure the protrusion 820 to the substrate 822. In some embodiments, the joint compound 826 is an electrical and/or thermal conductor. In one embodiment, the joint compound 826 is a solder. The joint compound 826 at least partially surrounds the convex portion of protrusion 820. In some embodiments, the joint compound 826 extends from the first portion 812 and second portion 814 of the lead 811 to the top side 824 of the substrate 822.

The shape of the protrusion 820 may improve the connection between the leadframe package 800 and the substrate 822. In one embodiment, the shape of the protrusion 820 allows the joint compound 826 to bond with a large surface area of the lead 811, but without the leadframe package 800 and the substrate 822 exerting a compression force on the joint compound 826. One potential benefit of preventing a compression force on the joint compound is that compression can cause the joint compound 826 to be moved out of position between the lead 811 and the substrate 822. For example, without the protrusion 820, if a sufficient force is applied to bring the leadframe package 800 and the substrate 822 together, the joint compound will be expelled from between the two elements. With the designs shown, the convex part of protrusion 820 can be placed in abutting contact with the substrate 822. Some slight pressure can be applied to provide firm, abutting contact with a metal pad 823. Even if large pressure is applied, the joint compound 826 will not be compressed. Rather, the joint compound 826 can flow along on sides of the convex protrusion 820 of the lead 811 to provide a large surface area for electrical contact to the substrate 822. The encapsulant 810 in the concave region provides protruding portion 818 that mechanically supports the lead 811.

In addition, the shape of the protrusion 820 can promote a better connection electrically or mechanically between the leadframe package 800 and the substrate 822. For example, the protruding portion 816 of the lead 811 may have poor wettability characteristics for the joint compound 826. By having a protrusion 820 pierce a bubble of joint compound 826 on the substrate 822, an otherwise poor connection between the joint compound 826 and the leadframe 802 may be improved.

Viewing FIG. 8, it can be seen that the joint compound 826 flows up to be above a portion of the protruding portion 818 of the encapsulant 810. Namely, the level of the joint compound 826 is thicker than the thickness of the lead 811 at the protruding portion 816 and extends to a height above the thickness of the lead 811 to overlap the protruding portion 818. A single common flat plane approximately parallel to the top side 824 can therefore be selected that intersects the joint compound 826, the lead 811 and the encapsulant 810 at the protruding portion 818 in the concave portion of the lead 811.

Figure 9:
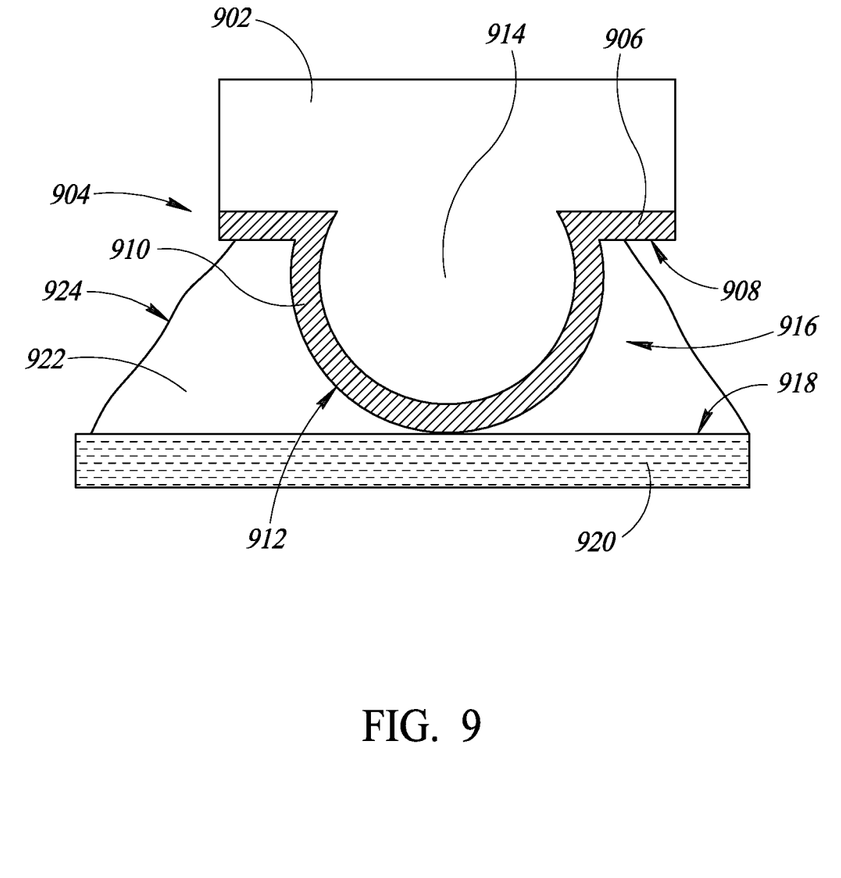
FIG. 9 is a cross-sectional view of a protrusion on a substrate.

FIG. 9 is a cross-sectional view of a protrusion 916 on a substrate 920. Similar to the other figures described throughout this disclosure, an encapsulant 902 supports a lead 904 that is part of a leadframe. The lead 904 includes a first portion 906 with a bottom side 908. The lead also includes a protruding portion 910 with a bottom side 912. The protruding portion 910 of the lead 904 forms a recess, and inside the recess is a protruding portion 914 of the encapsulant 902. The protruding portion 910 of the lead 904 and the protruding portion 914 of the encapsulant 902 form a protrusion 916. The protrusion 916 extends away from the bottom side 908 of the first portion of the lead 904. The bottom side 912 of the protrusion 916 is on a top side 918 of a substrate 920. The substrate 920 may include a contact pad positioned on the top side 918 of the substrate 920, the contact pad coupled to the protrusion 916 by a joint compound 922.

As is shown in FIG. 9, the joint compound 922 may generally surround the protrusion 916. In some embodiments, the joint compound 922 has a width at the top side 918 of the substrate 920 that is larger than a width of the joint compound 922 closest to the bottom side 908 of the first portion 906. In some embodiments, the joint compound 922 extends from the top side 918 of the substrate 920 to the bottom side 908 of the package, as is shown. In this embodiment, a top of the bottom side 912 serves as an anchor region for the joint compound 922. As can be seen, the joint compound 922 is so high that parts of it are in the same plane with the encapsulant 914 in the concave portion of the lead 904. The top of the bottom side 912 may be a portion of the bottom side 912 that is above 50% of a circle that defines a shape of the bottom side 912. Other definitions of top of the bottom side 912 are possible for this shape and for other shapes. In other embodiments, the joint compound 922 does not extend to the bottom side 908. And in yet other embodiments, the joint compound 922 only covers a portion of the protrusion 916. In some embodiments, the bottom side 912 of the protruding portion 910 of the lead 904 is in contact with the substrate 920; however in other embodiments, the bottom side 912 of the protruding portion 910 of the lead 904 is spaced apart from the substrate 920 by the joint compound 922. A side 924 of the joint compound 922 may be linear, curved, freeform, or any other shape. A side 924 with curvature may be curved concave or convex, and any curvature may only apply to a portion of the side 924.

Figure 10:
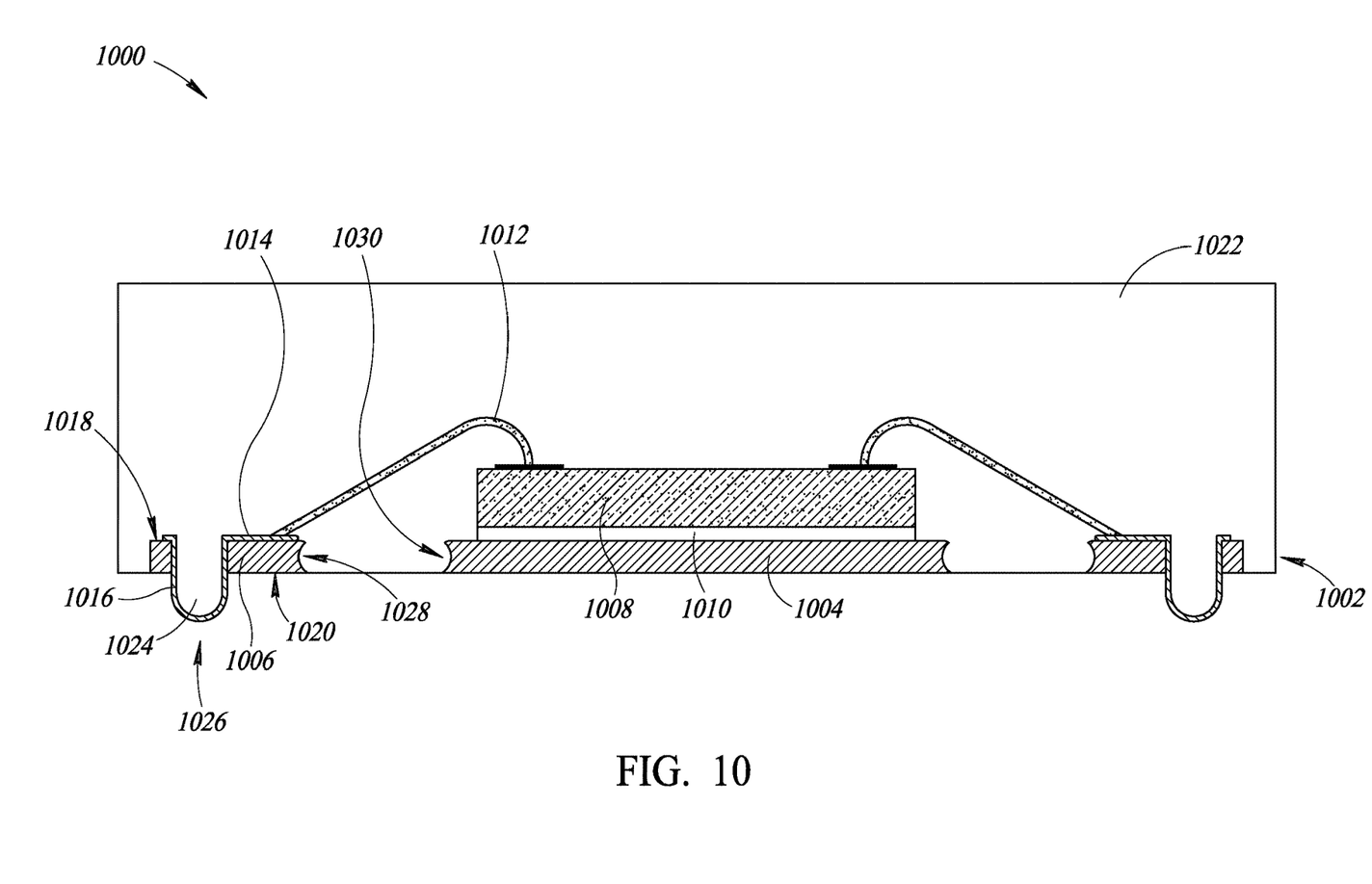
FIGS. 10 and 11 are cross-sectional views of alternate embodiments of a leadframe with a protrusion.

FIG. 10 is a cross-sectional view of an alternate embodiment of a leadframe package according to the present disclosure. Similar to embodiments discussed with respect to other figures, leadframe package 1000 includes a leadframe 1002 having a die pad 1004 and a lead 1006. The die pad 1004 of the leadframe 1002 supports a semiconductor die 1008 through an adhesive 1010. The semiconductor die 1008 is electrically coupled to the lead 1006 using an electrical connector 1012.

In the embodiment shown in FIG. 10, the lead 1006 includes a conductive layer 1014. The conductive layer 1014 is formed on a top side 1018 of the lead 1006, and through a recess in the lead 1006 to form a protruding portion 1016 that extends away from a bottom side 1020 of an encapsulant 1022. The encapsulant 1022 also extends into a recess formed by the protruding portion 1016 of the conductive layer 1014 to form a protruding portion 1024 of the encapsulant 1022. The protruding portion 1016 of the conductive layer 1014 with the protruding portion 1024 of the encapsulant 1022 form a protrusion 1026. The conductive layer 1014 may be made of tin, a tin alloy, or some other conductive material. In particular, the conductive layer 1014 may be formed from a material with superior wettability characteristics compared to a material the lead 1006 is formed from. In some embodiments, the conductive layer 1014 is formed from a plating or metallizing process.

The layer 1014 can be a separate, thinner layer than the lead frame 1002 because the encapsulant 1022 goes into the concave region to have a protruding 1024 that provides rigidity and mechanical strength to support the protrusion. In this case, it is not a protrusion of the lead itself, but a protrusion of an insert into a layer on the lead.

Additionally, FIG. 10 includes encapsulant locks in the leadframe 1002. An encapsulant lock 1028 is on a side of the lead 1006 nearest the die pad 1004 of the leadframe 1002. In one embodiment of the encapsulant lock 1028 shown on FIG. 10, the side of the lead 1006 nearest the die pad 1004 of the leadframe 1002 has a concave shape such that the encapsulant 1022 protrudes into a recess in the lead 1006. In other embodiments, the encapsulant lock 1028 is formed by a rectangular or other shaped recess in the side of the lead 1006 nearest the die pad 1004 of the leadframe 1002. In some embodiments, the encapsulant lock 1028 is a protrusion or anchor extending from the side of the lead 1006 nearest the die pad 1004 of the leadframe 1002. In some embodiments, the die pad 1004 includes an encapsulant lock 1030 on a side of the die pad 1004 nearest the lead 1006. The encapsulant lock 1030 on the side of the die pad 1004 may be a mirror image of the encapsulant lock 1028, or in other embodiments, the encapsulant lock 1030 has a different form from the encapsulant lock 1028.

Figure 11:
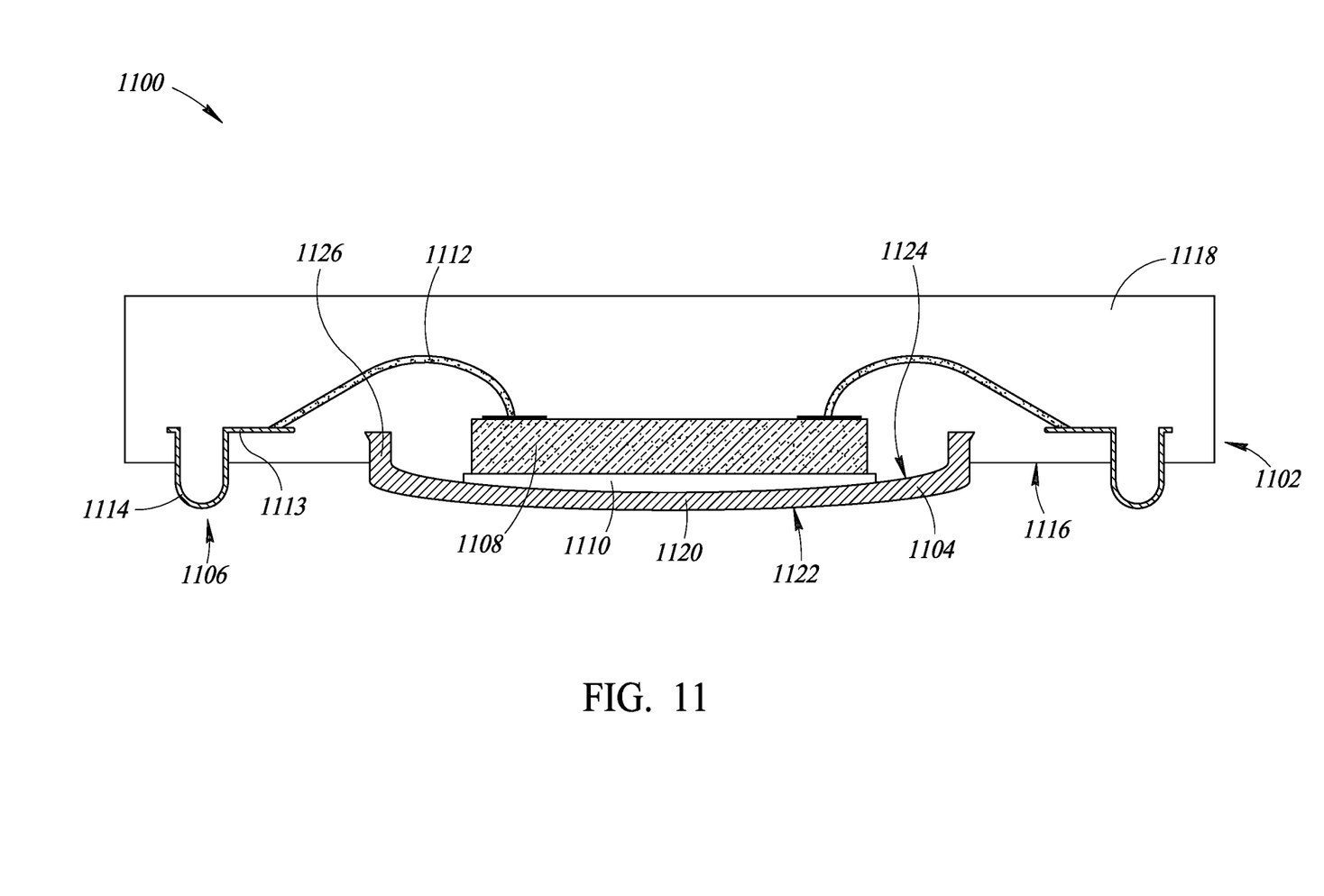

FIG. 11 is a cross-sectional view of an alternate embodiment of a leadframe package according to the present disclosure. Similar to embodiments discussed with respect to other figures, leadframe package 1100 includes a leadframe 1102 having a die pad 1104 and a lead 1106. The die pad 1104 of the leadframe 1102 supports a semiconductor die 1108 through an adhesive 1110. The semiconductor die 1108 is electrically coupled to the lead 1106 using an electrical connector 1112.

In the embodiment shown in FIG. 11, the lead includes a first portion 1113 and a protruding portion 1114, the protruding portion 1114 extending away from a bottom side 1116 of an encapsulant 1118. The lead 1106 is shown having a similar size and shape as the conductive layer 1014 of FIG. 10. In some embodiments, the lead 1106 is a conductive layer. In some embodiments, the lead 1106 is an etched portion of the material used to form the die pad 1104. And in some embodiments, the lead 1106 is a different layer of material from the conductive layer and die pad materials described above. In the embodiment shown in FIG. 11, the first portion 1113 of the lead 1106 is surrounded by encapsulant 1118 and the protruding portion 1114 of the lead 1106 extends out of the bottom side 1116 of the encapsulant 1118. In some embodiments, leadframe material on the lead 1106 is etched way completely.

Additionally, FIG. 11 depicts an embodiment of leadframe package of the present disclosure in which the die pad 1104 also includes a protruding portion. In this embodiment, the die pad 1104 of the leadframe 1102 has a protruding portion 1120. The protruding portion 1120 of the die pad 1104 has a bottom side 1122 and a top side 1124. The protruding portion 1120 of the die pad 1104 extends out of the bottom side 1116 of the encapsulant 1118. In some embodiments, the die pad 1104 is a leadframe layer formed from a plating or metallizing process. In some embodiments, the die pad 1104 is an etched portion of the material used to form the leadframe 1102. And in some embodiments, the die pad 1104 is a different layer of material from the leadframe layer and the leadframe 1102. In some embodiments, the protruding portion 1120 has a width greater than a width of the semiconductor die 1108. This embodiment allows at least a portion of the semiconductor die 1108 to be positioned in a recess of the protruding portion 1120 of the die pad 1104. Additionally, the encapsulant may be positioned in the recess of the protruding portion 1120 of the die pad 1104.

The lead 1106 can be any of the type shown and described with respect to FIGS. 1-10. In some embodiments, the protruding portion 1120 of the die pad 1104 extends away from the bottom side 1116 of the encapsulant 1118 an equal distance as the distance the protruding portion 1114 of the lead 1106 extends away from the bottom side 1116 of the encapsulant 1118. In other embodiments, the protruding portion 1120 of the die pad 1104 does not extend away from the bottom side 1116 of the encapsulant 1118 an equal distance as the distance the protruding portion 1114 of the lead 1106 extends away from the bottom side 1116 of the encapsulant 1118. In some embodiments, the protruding portion 1120 of the die pad provides the semiconductor die 1108 a thermal and/or electrical connection to a substrate, with the semiconductor die 1108 coupled to the die pad 1104 through the adhesive 1110 on the top side 1124 of the protruding portion 1120. In this embodiment, the bottom side 1122 of the protruding portion 1120 may be surrounded by a joint compound on the substrate in a manner similar to the various ways discussed about with respect to a protrusion for a lead on a substrate.

In some embodiments, the die pad 1104 includes an encapsulant lock 1126 on a side of the die pad 1104. In the embodiment shown in FIG. 11, the encapsulant lock 1126 is an anchor comprising a flared end in the encapsulant 1118. The flared end of the encapsulant lock 1126 secures the die pad 1104 to the encapsulant 1118 preventing the die pad 1104 from slipping out of the encapsulant 1118 when under temperature or mechanical stresses.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A package comprising:
a die pad having a first side and a second side;
a semiconductor die coupled to the first side of the die pad;
a bond pad on a first side of the semiconductor die;
a lead spaced from the die pad, the lead having a first side, a second side, and a recess;
a conductive layer on the first side of the lead and in the recess, the conductive layer forming a protrusion that extends beyond the second surface of the lead;
an electrical connector having a first end coupled to the bond pad and a second end coupled to the lead; and
an encapsulant that overlays the semiconductor die, the die pad, and the first side of the lead, wherein the encapsulant surrounds the electrical connector.

2. The package of claim 1 wherein the second end of the electrical connector is coupled to the conductive layer.

3. The package of claim 1 wherein the protrusion has an inner concave region that extends below the lead.

4. The package of claim 3 wherein the encapsulant fills the inner concave region of the protrusion.

5. The package of claim 3 wherein an outer surface of the protrusion is convex.

6. The package of claim 1 wherein an outer surface of the protrusion is shaped as one of: a triangle, a rectangle, a square, or an ellipsoid.

7. The package of claim 1 wherein an outer surface of the protrusion has a semicircular shape that is a portion of a circle.

8. The package of claim 1 wherein the second side of the lead is coplanar with a surface of the encapsulant.

9. The package of claim 1 wherein the protrusion extends beyond the encapsulant.

10. A method, comprising:
forming a conductive layer on a lead having a recess, wherein a portion of the conductive layer extends through and forms a protrusion that extends beyond the lead;
coupling a semiconductor die to a die pad;
electrically coupling the semiconductor die to the lead by an electrical connector; and
forming encapsulant over the semiconductor die, the lead, the electrical connector, and the die pad to form a semiconductor package, wherein the encapsulant surrounds the electrical connector.

11. The method of claim 10 wherein electrically coupling the semiconductor die to the lead comprises coupling a first end of a conductive wire to a bond pad of the semiconductor die and a second end of the conductive wire to the conductive layer on the lead.

12. The method of claim 10 wherein the protrusion includes an inner concave region.

13. The method of claim 12 wherein forming the encapsulant includes filling the inner concave region.

14. The method of claim 10, further comprising prior to forming the conductive layer, stamping the lead to form the recess in the lead.

15. The method of claim 10, further comprising coupling the semiconductor package to a substrate, wherein coupling the semiconductor package to the substrate includes coupling the protrusion to the substrate by a joint compound.

16. A system, comprising:
a leadframe package including a leadframe supporting a semiconductor die, the semiconductor die and the leadframe being covered by an encapsulant, the leadframe including a lead and a die pad, the semiconductor die being on the die pad and electrically coupled to the lead by an electrical connector, the lead having a through opening, wherein a conductive layer is on a surface of the lead and extending through the through opening to form a protrusion that extends beyond an outer surface of the lead.

17. The system of claim 16, wherein the conductive layer is metal material.

18. The system of claim 16, wherein the lead includes a first portion proximate the die, wherein the electrical connector is coupled to the first portion, wherein the through opening is proximate a side of the leadframe package that is away from the die pad.

19. The system of claim 16, wherein encapsulant material fills an inner portion of the protrusion.

20. The system of claim 19, wherein the encapsulant material is around side surfaces of the die pad and the lead and forms an outer surface of the leadframe package between the die pad and the lead, wherein the protrusion extends beyond the outer surface of the encapsulant material.

21. The system of claim 16, further comprising a printed circuit board having a surface contact, wherein the protrusion is coupled to the surface contact by a joint compound.

* * * * *